(12) United States Patent
Bauer et al.

(10) Patent No.: US 7,772,036 B2
(45) Date of Patent: Aug. 10, 2010

(54) LEAD FRAME BASED, OVER-MOLDED SEMICONDUCTOR PACKAGE WITH INTEGRATED THROUGH HOLE TECHNOLOGY (THT) HEAT SPREADER PIN(S) AND ASSOCIATED METHOD OF MANUFACTURING

(75) Inventors: Robert Bauer, Ismaning (DE); Anton Kolbeck, Bayern (DE)

(73) Assignee: Freescale Semiconductor, Inc., Austin, TX (US)

( * ) Notice: Subject to any disclaimer, the term of this patent is extended or adjusted under 35 U.S.C. 154(b) by 455 days.

(21) Appl. No.: 11/398,944

(22) Filed: Apr. 6, 2006

(65) Prior Publication Data
US 2007/0238205 A1   Oct. 11, 2007

(51) Int. Cl.
*H01L 21/00* (2006.01)
(52) U.S. Cl. ............ 438/112; 257/675; 257/722; 257/E21.499
(58) Field of Classification Search ................ 361/704, 361/709, 718; 438/112; 257/675, 722, E21.499
See application file for complete search history.

(56) References Cited

U.S. PATENT DOCUMENTS

| | | | |
|---|---|---|---|
| 5,410,451 A | 4/1995 | Hawthorne et al. | |
| 5,583,377 A * | 12/1996 | Higgins, III | 257/707 |
| 5,656,550 A * | 8/1997 | Tsuji et al. | 438/123 |
| 5,905,299 A | 5/1999 | Lacap | |
| 5,973,923 A | 10/1999 | Jitaru | |
| 6,011,304 A | 1/2000 | Mertol | |
| 6,239,487 B1 * | 5/2001 | Park et al. | 257/712 |
| 6,784,537 B2 * | 8/2004 | Moriguchi | 257/706 |
| 6,861,750 B2 * | 3/2005 | Zhao et al. | 257/739 |
| 7,453,145 B2 * | 11/2008 | Brinkis et al. | 257/717 |
| 2003/0006055 A1 * | 1/2003 | Chien-Hung et al. | 174/52.1 |
| 2004/0156172 A1 | 8/2004 | Lin et al. | |
| 2005/0110137 A1 | 5/2005 | Coyle | 257/735 |
| 2005/0230820 A1 * | 10/2005 | Licht | 257/720 |

FOREIGN PATENT DOCUMENTS

CN   1737418 A   2/2010

OTHER PUBLICATIONS

International Search Report and Written Opinion dated Nov. 23, 2007.
Buysse, "Terminal blocks: Through-hole reflow technology makes the grade," Connector Specifier (2004) Online Oct. 1, 2004.
R. Bauer, "Leadframe based, Overmolded QFN style semiconductor package with preapplied solder depot, and methods of manufacturing the same," 2005, 6 pages.

* cited by examiner

*Primary Examiner*—Zandra Smith
*Assistant Examiner*—Christy L Novacek
(74) *Attorney, Agent, or Firm*—Hamilton & Terrile, LLP; Michael Rocco Cannatti

(57) ABSTRACT

A method and apparatus are provided for manufacturing a lead frame based, over-molded semiconductor package (7) with an exposed pad or power die flag (70) having multiple integrated THT heat spreader pins (71) configured for insertion into one or more vias (77) formed in a printed circuit board (78). The through hole heat spreader pins (71) may be formed as an integral part of the exposed pad (52) or may be solidly connected with the exposed pad (62).

9 Claims, 5 Drawing Sheets

LEAD FRAME BASED, OVER-MOLDED SEMICONDUCTOR PACKAGE WITH INTEGRATED THROUGH HOLE TECHNOLOGY (THT) HEAT SPREADER PIN(S) AND ASSOCIATED METHOD OF MANUFACTURING

BACKGROUND OF THE INVENTION

1. Field of the Invention

This invention relates to lead frame based semiconductor packages and a method of manufacturing the same. In one aspect, the present invention relates to a lead frame based over-molded semiconductor package with an exposed pad having an improved electrical and thermal path within the package as well as within the completed assembly of package and printed circuit board (PCB) or any other substrate material.

2. Description of the Related Art

Semiconductor packages with exposed pad (i.e., PQFN, QFN, HSOP, SOIC, QFP, TQFP, MO-188 etc.) provide a thermal path within the package to conduct heat from the integrated circuit die to the printed circuit board (PCB). After PCB assembly, the highest thermal resistance values within the intended heat path are induced by the thermal vias of PCB which lead through the PCB onto the PCB backside where a large copper plane acts as a heat sink. Thermal resistivity of the heat path can also be increased by typical assembly issues, such as solder voiding. As shown in U.S. Patent Application Publication No. 2005/0110137, conventional approaches for dissipating heat do not address the issue of the high thermal resistivity generated by the thermal vias of the PCB.

Accordingly, a need exists for a semiconductor packaging apparatus and process which reduces the thermal resistance values within the intended heat path. In addition, a need exists for a packaging device and methodology which reduces the heat path from the die attach pad to the package outside. There is also a need for device packaging that avoids the process and performance limitations associated with typical assembly issues during the packaging process. In addition, there is a need for improved semiconductor processes and devices to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
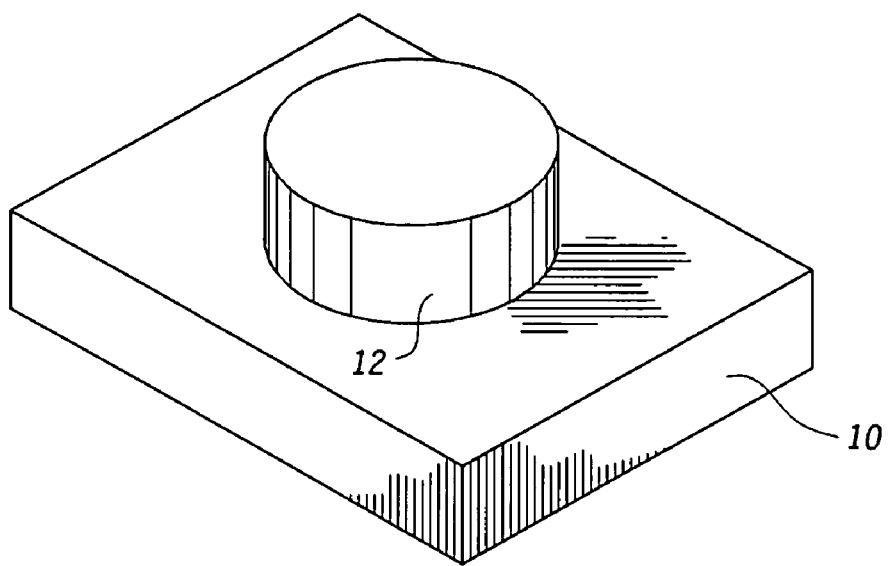
FIG. 1 illustrates a diagonal view of the bottom of an example body structure of an exposed pad having an integrated THT heat spreader pin.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for packaging a semiconductor device using a lead frame-based over-molded semiconductor package with one or more through hole technology (THT) heat spreader pin(s) on an exposed pad as a direct electrical and heat path having reduced resistance. By integrally forming or attaching the heat spreader pin(s) to an exposed die pad, a direct and short electrical and heat path is provided from the die attach pad to the package outside. The THT heat spreader pins may be manufactured in the lead frame manufacturing process, or may be pre-formed ahead of the actual package manufacturing process.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings without including every feature or geometry in order to avoid limiting or obscuring the present invention. It is also noted that, throughout this detailed description, certain example packaging structures are depicted which may be formed using any desired manufacturing techniques for etching, milling, punching, machining or otherwise forming such structures at appropriate dimensions and sizes. Such details are well known and not considered necessary to teach one skilled in the art of how to make or use the present invention.

Figure 2:
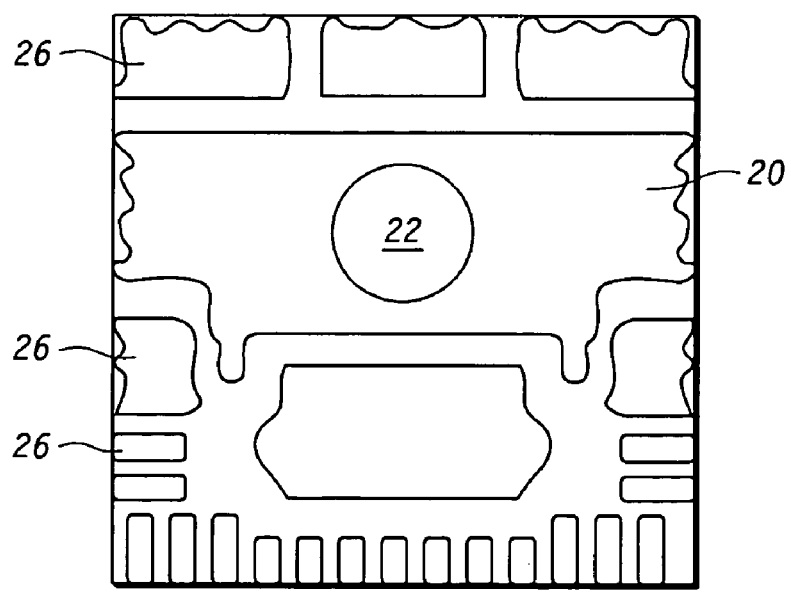
FIG. 2 illustrates a bottom view of an example package assembly with a single THT pin body structure.

FIG. 1 illustrates a diagonal view of the bottom of an example body structure 1 of an exposed pad or lead frame 10 having an integrated THT heat spreader pin 12. The lead frame 10 is basically the substrate or "back bone" carrier of a package. The lead frame 10 is typically metallic and conductive, although not always so. The lead frame 10 includes a die flag which carries semiconductor chips. In accordance with selected embodiments, the surface of the exposed pad 10 includes one or more through hole technology heat spreader (s) 12. While FIG. 2 shows a single cylindrical-shaped pin structure 12 protruding from the surface of the package, it will be appreciated that other shapes may be used for the pin structure 12, so long as the pin structure(s) protrude sufficiently away from the surface of the exposed pad 10 to permit physical engagement and contact with the PCB vias (as described hereinbelow). Whatever shape is used, the through hole heat spreader pin 12 may be formed as an integral part of the exposed pad 10 so that it is manufactured in one part with the exposed pad 10. For example, the pad and THT pin could be integrally manufactured using etching, milling, punching or other machining procedures during the lead frame manufacturing process. Alternatively, the THT pin 12 may be manufactured separately from the pad 10 and then attached or connected with the exposed pad, such as by adding or inserting the THT pin 12 to the lead frame structure after manufacturing the lead frame body or pad 10 with press fit, cold welding, or other suitable connection techniques. The way in which the THT pins(s) 12 are produced could be of any appropriate type for the various embodiments of the present invention described herein.

Referring now to FIG. 2, a bottom view is illustrated of an example power quad flat pack no-lead (PQFN) package assembly 2 with a single THT pin body structure 22. The depicted package is shown with a number of lead frame components or other devices and connectors 26. In addition, the package is shown with an exposed pad 20 featuring one integrated THT heat spreader pin 22 which protrudes from the surface of the exposed pad 20 as previously indicated in other embodiments and drawings.

Figure 3:
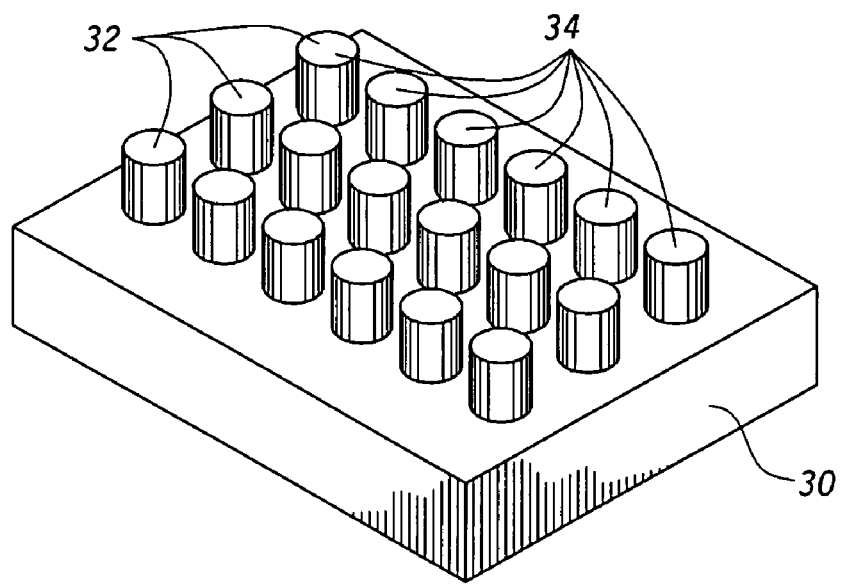
FIG. 3 illustrates a diagonal view of the bottom of an alternative example body structure of an exposed pad having a plurality of integrated THT heat spreader pins.

Referring to FIG. 3, a diagonal view is illustrated of the bottom of an alternative example body structure 3 of an exposed pad or lead frame 30 having a plurality of integrated THT heat spreader pins 32, 34. As illustrated, the THT pins are arranged in rows (e.g., pin row 34) and columns (e.g., pin column 32) which define a regular grid pattern. FIG. 3 shows three rows and six columns of THT pins forming a grid pattern, though it will be appreciated that other patterns may also be used. Again, the pattern or grid of THT pins 32, 34 can be formed integrally with the exposed pad 30 or subsequently by inserting or attaching the pins 32, 34 to the pad 30.

Figure 4:
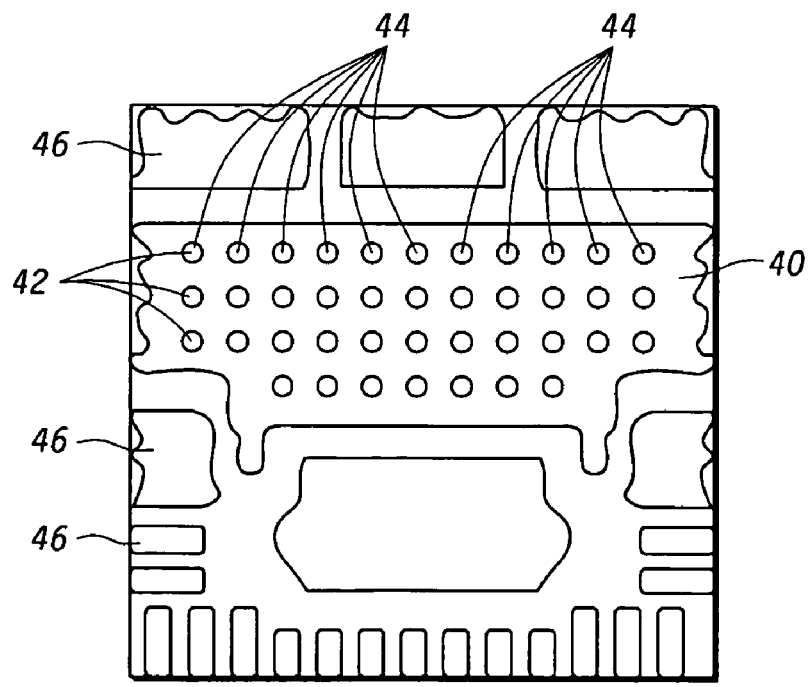
FIG. 4 illustrates a bottom view of an example package assembly with a body structure with multiple THT pins.

FIG. 4 illustrates a bottom view of an example PQFN package with a body structure having multiple THT pins 42, 48. The depicted package is shown with a number of lead frame components or other devices and connectors 46. As illustrated, the package is shown with an exposed pad 40 featuring a plurality integrated THT heat spreader pin 42, 48 which protrude from the surface of the exposed pad 40 as previously indicated in other embodiments and drawings.

Figure 5:
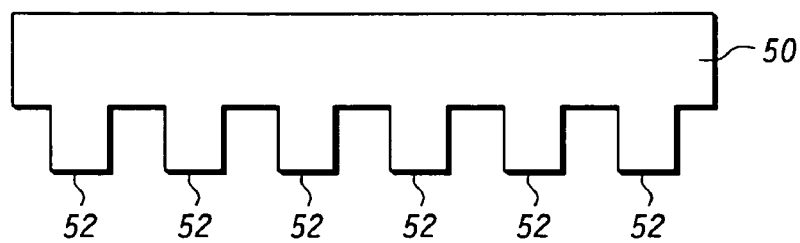
FIG. 5 illustrates a side view of a multi-pin body structure in accordance with various embodiments of the present invention.
Figure 6:
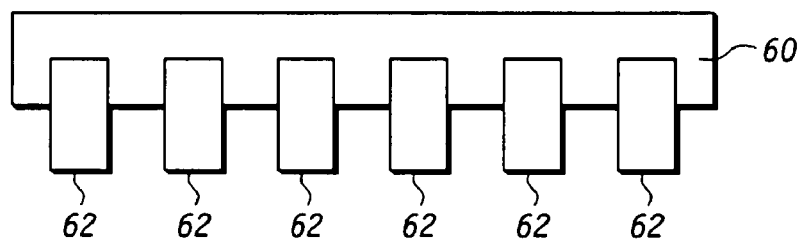
FIG. 6 illustrates a side view of a multi-pin body structure in accordance with various alternative embodiments of the present invention.

FIG. 5 illustrates a side view of a multi-pin body structure 5 in accordance with various embodiments of the present invention wherein one or more THT heat spreader pins 52 are manufactured as an integral part of the exposed pad 50 during lead frame manufacturing. As depicted, each integrally formed pin 52 protrudes or extends perpendicularly from the pad 50, though other protrusion angles can be used, such as when the pins are configured for insertion into PCB vias having non-standard configurations. Accordingly, other shapes of for the THT pins 52 will provide the same advantages and this invention. In accordance with various alternative embodiments of the present invention, FIG. 6 illustrates a side view of a multi-pin body structure 6 wherein the THT heat spreader pins 62 are manufactured separately and inserted into the exposed pad 60. For example, during lead frame manufacturing of the pad 60, one or mounting holes 64 are formed in the exposed pad 60. Subsequently, THT heat spreader pins 62 are inserted into the mounting holes 64 using any desired attachment or connection technique for solidly connecting the pins 62 and pad 60.

Figure 7:
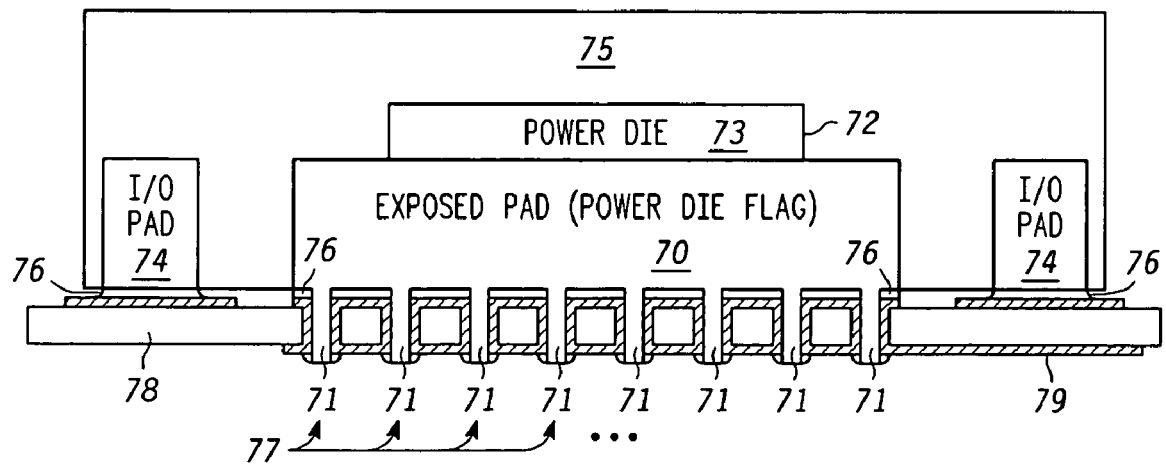
FIG. 7 illustrates a cross section where a package with an exposed pad having multiple integrated THT heat spreader pins is mounted onto a printed circuit board.

FIG. 7 illustrates a cross section of a PQFN lead frame package 7 with an exposed pad or power die flag 70 having multiple integrated THT heat spreader pins 71 assembled on a printed circuit board 78. Though not depicted, the pins 71 may be formed in rows and columns as previously described. The depicted package 7 includes one or more input/output (I/O) pads 74, an integrated circuit 73 (e.g., power die), a lead frame 70 and die attach material 72 (e.g., solder, conductive epoxy or any other applicable adhesive material) connecting the power die 73 to the lead frame 70. These elements are encased in mold compound 75 which is typically in the form of an epoxy compound or any other appropriate material that is applied to encase the power die 73, I/O pads 74 and power die flag 70 as illustrated, leaving exposed the bottom of the pads 70, 74 and the THT heat spreader pins 71 (which were either integrally formed with the power die flag 70 or subsequently fixedly attached thereto). The mold compound encapsulated package may then attached to the printed circuit board (PCB) 78 by applying a solder joint 76 between the PCB 78 and any device placed thereon, and then inserting the THT heat spreader pins 71 into via openings 77 formed in the PCB 78. As illustrated, the PCB 78 includes a PCB conductor layer 79 formed at a predetermined thickness (e.g., approximately 0.35 microns of copper) on the surfaces of the PCB vias 77, as well as on the top and bottom surface of the PCB 78. Each via 77 has a predetermined width (e.g., approximately 0.5 mm diameter) that is wider that the width of the THT pin 71 (e.g., approximately 0.4 mm pin diameter), and the THT pin length (e.g., approximately 1.5 mm) may be selected so that the pin 71 contacts the conductor layer 79 in the via 77 and extends completely through the via 77. Of course, it will be appreciated that other thickness, width and length dimensions can be used, depending on the pin configuration and packaging type.

In the embodiment shown in FIG. 7, the upper surface of the die flag is disposed in contact with the integrated circuit die to transfer heat generated at the integrated circuit die directly to the THT heat spreader pins 71, which in turn directly transfer the heat to the PCB vias 77 and copper plane 79. In this way, the trough hole heat spreader pins 71 provide the package with a built-in, optimized heat path to the PCB 78 after assembly which increases on-board performance by increasing the thermal performance (e.g. by up to at least a factor of three) compared to state-of-the-art assembly technologies. In addition, most potential board attach-related issues which may limit the package on-board performance are eliminated. Also, the heat spreader pins 71 provide a self-alignment benefit during PCB assembly. Because the heat spreader pins 71 reduce the thermal resistance of the heat path between the die 73 and the PCB copper plane 79, the lead frame 70 may be used with power applications to attach a power die 73 to the PCB 78.

Figure 8:
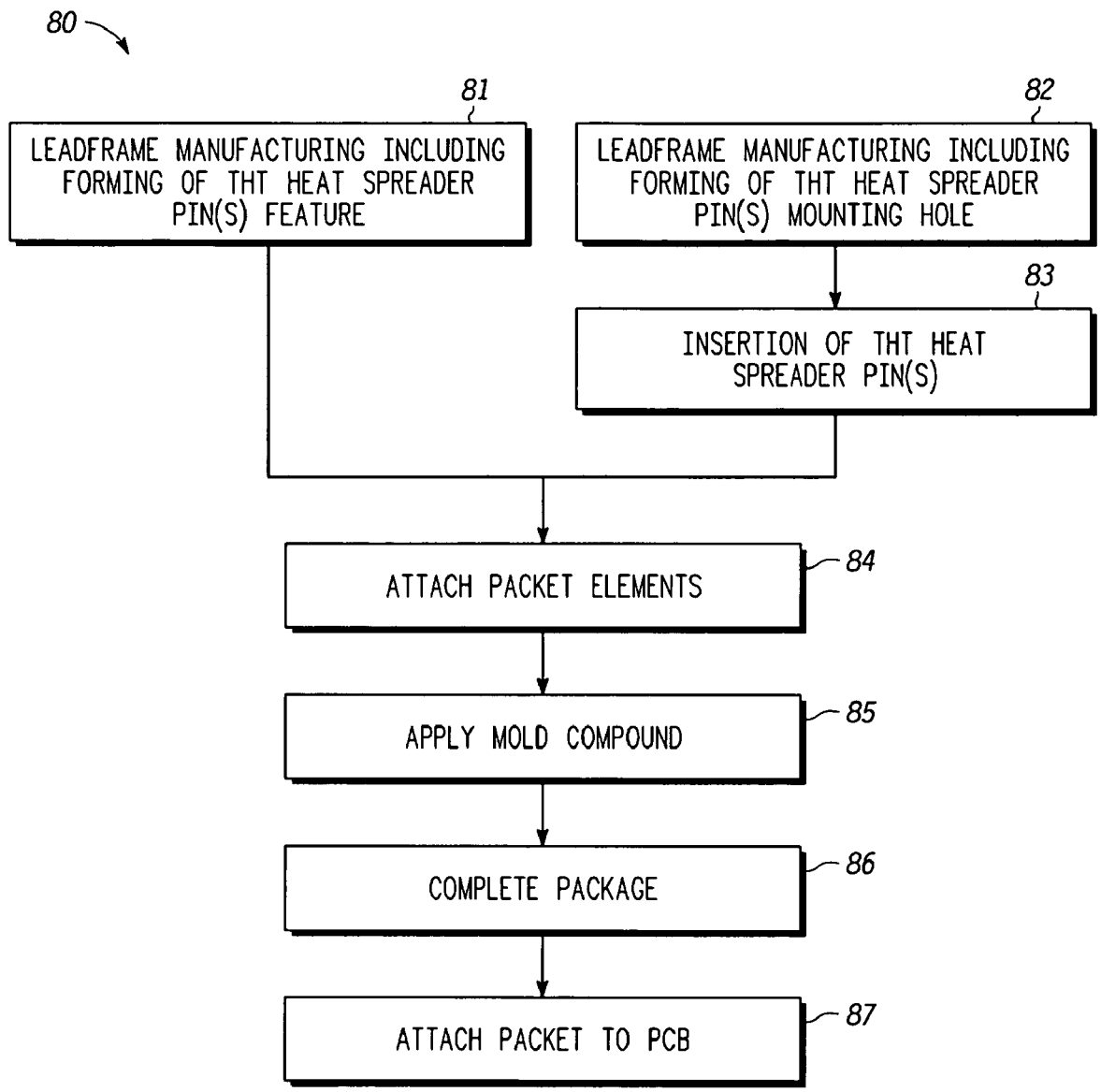
FIG. 8 is a diagram showing the manufacturing process for a package in accordance with various embodiments of the present invention.

FIG. 8 is a flow chart diagram showing an example process 80 for manufacturing a package in accordance with various embodiments of the present invention. As a preliminary step, one or more heat spreader pins are integrally formed in an exposed pad of a lead frame by etching, milling, punching, machining or otherwise forming the THT pins as an integral part of the pad (81). For packages with etched lead frames, the heat spreader pins may be readily manufactured since the etching processes used to manufacture the lead frames can be used to pattern the THT pin(s) on the surface of the exposed pad without having additional steps to the overall process. Alternatively, the heat spreader pins may be separately formed and attached by manufacturing the lead frame to include mounting holes (82) and then inserting separately-formed THT pins to the lead frame (83), such as by attaching, connecting, press fitting, cold welding, or otherwise coupling the pins to the lead frame.

The various components to be connected to the lead frame may then be attached on the upper surface of the lead frame. These components will typically be those which form part of a package that is to be mold encapsulated to some degree or another. The exact nature of the components will depend on the device and the ultimate use of the resulting package (84). A mold compound is then applied to the various components of the package (85). This process can be carried out in various different ways, including mold pressing or other mold compound application methods. The package is then completed as appropriate for the use required. This may include removal of some of the mold compound from certain areas for connections, addition of leads, etc. to be included (86). The package is then attached to a PCB or other device using a soldering process (87). The presence of the THT heat spreader pins allows the package to be aligned with the PCB vias.

Figure 9:
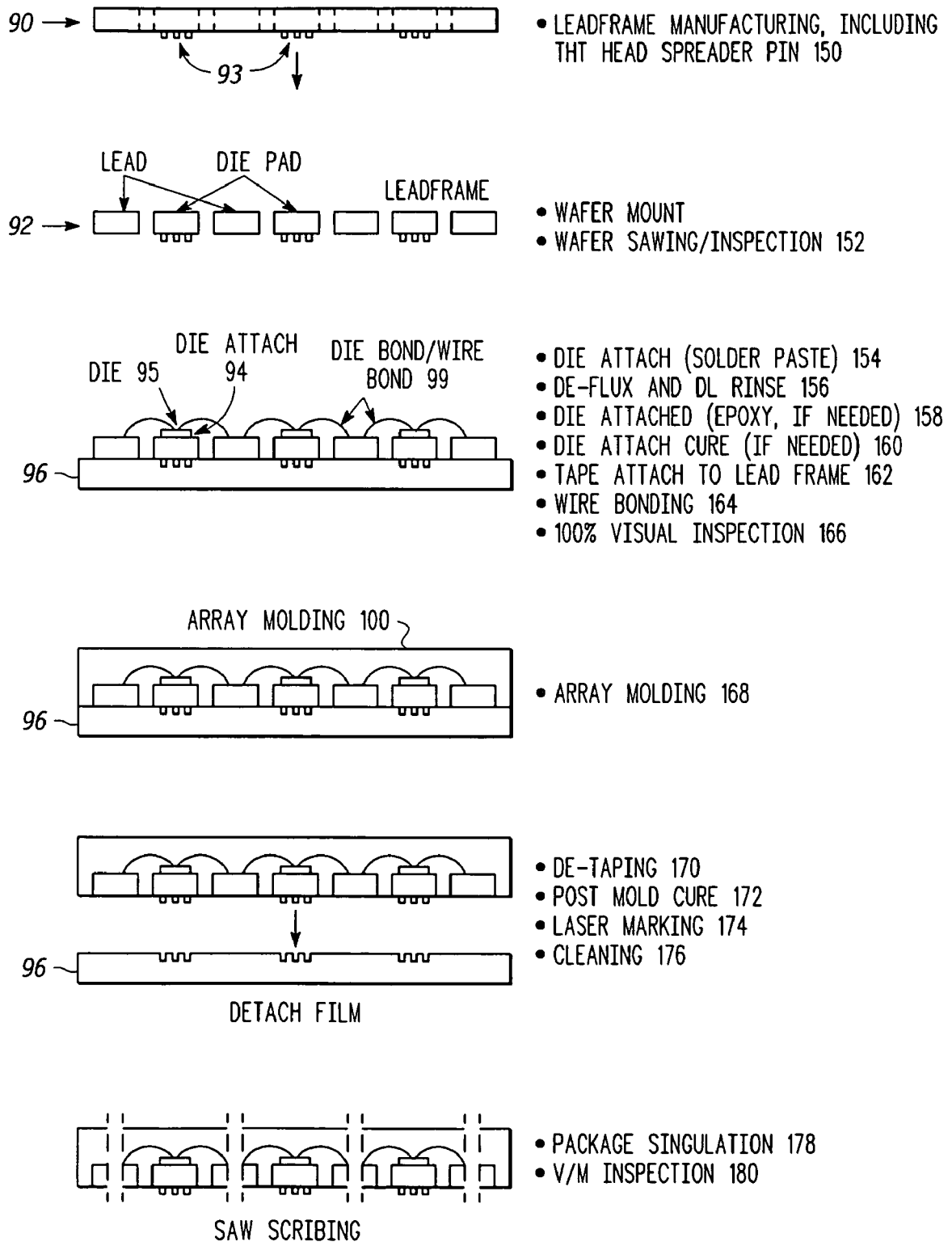
FIG. 9 is a diagram showing various manufacturing process steps which may be used for a package in accordance with various embodiments of the present invention.

The manufacturing process of the package may include further steps that are common place in the environment of manufacturing a semiconductor package. FIG. 9 shows an example sequence of manufacturing process steps which may be used for a package in accordance with various embodiments of the present invention, though it will be appreciated that there are many other variations. As depicted in FIG. 9, a single lead frame or a set (i.e. matrix) of lead frames 90/92 is manufactured and patterned with one or more THT heat spreader pins 93 formed on the exposed pads thereof (150). After mounting the wafer, one or more different silicon wafers are split into single semiconductor dies by sawing or other appropriate means and are inspected (152).

After die solder paste or any other appropriate die attach material (94) is applied (154), the semiconductor die(s) 95 is/are placed into the die attach material 94, and then cured or reflowed. A de-flux and DI-Water rinse step may then be carried out (156). If required, an epoxy or any other appropriate die attach material is applied (158), and additional semiconductor dies are placed into the die attach material and/or a die attach cure is carried out (160). A tape (96) is attached to the lead frames (162) to provide a support panel, wire bonds (99) are applied (164), and a visual check is carried out (166).

A molding compound (100) is applied (168) and the tape 96 is removed (170) to separate the support panel. A post mold cure (172) and laser marking (174) steps are followed by a cleaning stage (176). The package is then split into individual elements (178) and inspected (180).

In one form there is provided herein a method of manufacturing a semiconductor package by mounting an integrated circuit die on an exposed pad that includes one or more heat spreader structures on an exposed first surface of the exposed pad. The heat spreader structures may be formed from any heat conducting material, such as copper, and may be formed as an integral part of the exposed pad using any desired technique, such as etching, milling, punching or machining a lead frame. Alternatively, the heat spreader structures may be formed separately from the exposed pad by forming an exposed pad having with at least one mounting hole formed in the exposed first surface, forming one or more heat spreader pins, and then affixing the heat spreader pins into the mounting hole of the exposed pad so that the first heat spreader pin protrudes from the exposed pad. In the method, an integrated circuit die is affixed to a surface of the exposed pad opposite the exposed first surface, and then the integrated circuit die and exposed pad are encased in a compound, leaving exposed the exposed first surface and first heat spreader structure. Next, the first heat spreader structure is attached to a printed circuit board, such as by inserting the heat spreader structure through a via formed in the printed circuit board.

In another form, there is provided a lead frame-based, over-molded semiconductor package with an exposed pad. The exposed pad includes one or more through hole technology heat spreader pins configured for insertion into a via formed in a printed circuit board, where the heat spreader pins may be formed as an integral part of the exposed pad, or may be formed separately from the exposed pad for subsequent fixed attachment to the exposed pad. In this way, heat spreader pins may be formed as part of any desired semiconductor package, including but not limited to PQFN, QFN, HSOP, SOIC, QFP, TQFP or MO-188 packages. In a selected embodiment, the exposed pad and heat spreader pin may be formed with copper, though any material that is electrically and thermally conductive may be used.

In yet another form, there is disclosed an electronic device, such as a power quad flat pack no-lead (PQFN) package assembly structure, that includes a die that is at least partially encapsulated in a mold structure. In addition, a die attach pad coupled to the die includes a first surface exposed from the mold structure and one or more (integrally or separately formed) first through hole technology heat spreader pins protruding from the first surface. For example, where the mold structure has a first bottom surface, the heat spreader pin and the first surface of the die attach pad are disposed in the mold structure to be exposed from the first surface of the mold structure. When a heat sink is disposed in thermal communication with the heat spreader pin of the die attach pad, heat from the die is thermally coupled to the pin and may be transferred to the heat sink.

Although the described exemplary embodiments disclosed herein are directed to various lead frame based semiconductor package structures and methods for making same, the present invention is not necessarily limited to the example embodiments which illustrate inventive aspects of the present invention that are applicable to a wide variety of processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, FIG. 7 does not show all the details of connections between various elements of the package, but it will be appreciated the leads, vias, bonds and other connection means can be used to effect any electrical connection. Similarly, other insulating materials can be used to electrically isolate various components. Also, any combination of devices, pads, dies, etc. can be used as required for the desired package. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. For example, the disclosed lead frame based semiconductor package structures provide an optimized thermal path within the package by reducing thermal resistance values within the intended heat path through the PCB onto the PCB backside (which features a large copper plane acting as a heat sink) by inserting a heat conducting or spreading pin structure into the thermal vias of PCB. In addition, typical assembly issues (i.e., solder voiding) which may limit the package on-board performance can be eliminated, and the heat spreader pins allow the package and PCB to be self-aligned during PCB assembly. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of manufacturing a semiconductor package by mounting an integrated circuit die on a pad, comprising:
    forming at least a first through hole technology (THT) heat spreader structure to protrude through a first surface of the pad;
    affixing an integrated circuit die to a second surface of the pad opposite the first surface; and
    encasing the integrated circuit die and pad in a compound, leaving exposed the first surface and first THT heat spreader structure.

2. The method of claim 1, where forming at least a first THT heat spreader structure comprises forming a plurality of heat spreader pins integrally to the pad.

3. The method of claim 1, where the first THT heat spreader structure comprises copper.

4. The method of claim 1, further comprising attaching the first THT heat spreader structure to a printed circuit board.

5. The method of claim 4, where attaching a first THT heat spreader structure comprises inserting the THT heat spreader structure through a via formed in the printed circuit board.

6. The method of claim 1, where forming at least a first THT heat spreader structure comprises forming a first heat spreader pin as an integral part of the pad.

7. The method of claim 6, where forming a first heat spreader pin as an integral part of the pad comprises etching, milling, punching or machining a lead frame.

8. The method of claim 1, where forming at least a first THT heat spreader structure comprises:
    forming a pad having at least one mounting hole formed in the first surface;
    forming at least a first heat spreader pin; and
    affixing the first heat spreader pin into said mounting hole of the pad so that the first heat spreader pin protrudes from the pad.

9. The method of claim 8, where affixing the first heat spreader pin into said mounting hole comprises press fitting, cold welding or inserting the first heat spreader pin.

* * * * *